United States Patent [19]
Shimizu

[11] Patent Number: 6,061,816
[45] Date of Patent: May 9, 2000

[54] TIMING GENERATOR FOR TESTING SEMICONDUCTOR STORAGE DEVICES

[75] Inventor: Akira Shimizu, Tokyo, Japan

[73] Assignee: Ando Electric Co., Ltd., Tokyo, Japan

[21] Appl. No.: 08/864,910

[22] Filed: May 29, 1997

[30] Foreign Application Priority Data

May 31, 1996 [JP] Japan ................................... 8-139257

[51] Int. Cl.[7] .............................................. G01R 31/28
[52] U.S. Cl. .......................................... 714/738; 714/743
[58] Field of Search ................................... 714/738, 744, 714/718, 743, 706; 365/201

[56] References Cited

U.S. PATENT DOCUMENTS

| | | | |
|---|---|---|---|
| 4,730,318 | 3/1988 | Bogholtz, Jr. et al. | 371/27.1 |
| 5,390,192 | 2/1995 | Fujieda | 371/27.1 |
| 5,651,014 | 7/1997 | Kobayashi | 371/27.1 |

*Primary Examiner*—Hoa T. Nguyen
*Attorney, Agent, or Firm*—Finnegan, Henderson, Farabow, Garrett & Dunner, L.L.P.

[57] ABSTRACT

A timing generator operates in response to test cycles to generate test pulses for testing of semiconductor storage devices. For example, the timing generator is designed to generate two test pulses with respect to each test cycle. Herein, a RAM stores timing data under the control of a CPU. When reading the timing data from the RAM, the timing generator receives a reference clock signal, on which clock pulses repeatedly occur by a certain period in synchronization with the test cycles, to produce a clock signal which contains two pulses with respect to each test cycle. Two read addresses are sequentially generated based on the reference clock signal and clock signal. Each read address is represented by a binary code consisting of a number of bits, one of which is inverted in response to the clock signal. So, two timing data are sequentially read from the two read addresses of the RAM with respect to each test cycle. A pulse generator receives the two timing data to generate two test pulses with respect to each test cycle. Herein, generation of the two test pulses is initiated when a time represented by the timing data elapses from a trigger signal, whilst a constant interval of time is provided between the two test pulses, regardless of the test cycles.

8 Claims, 10 Drawing Sheets

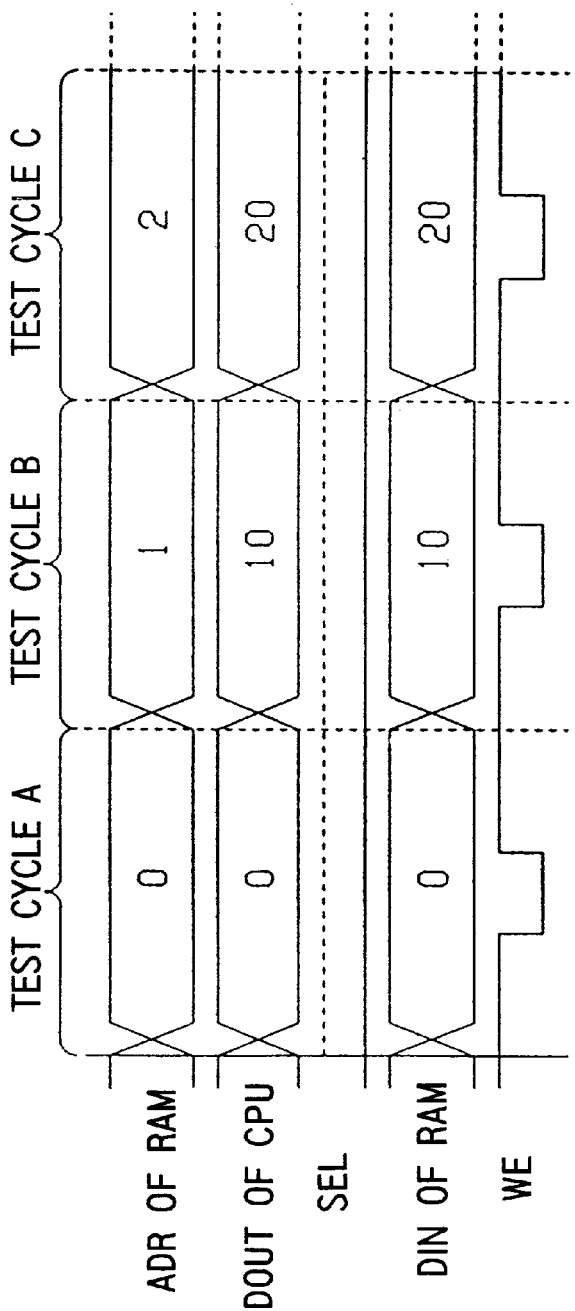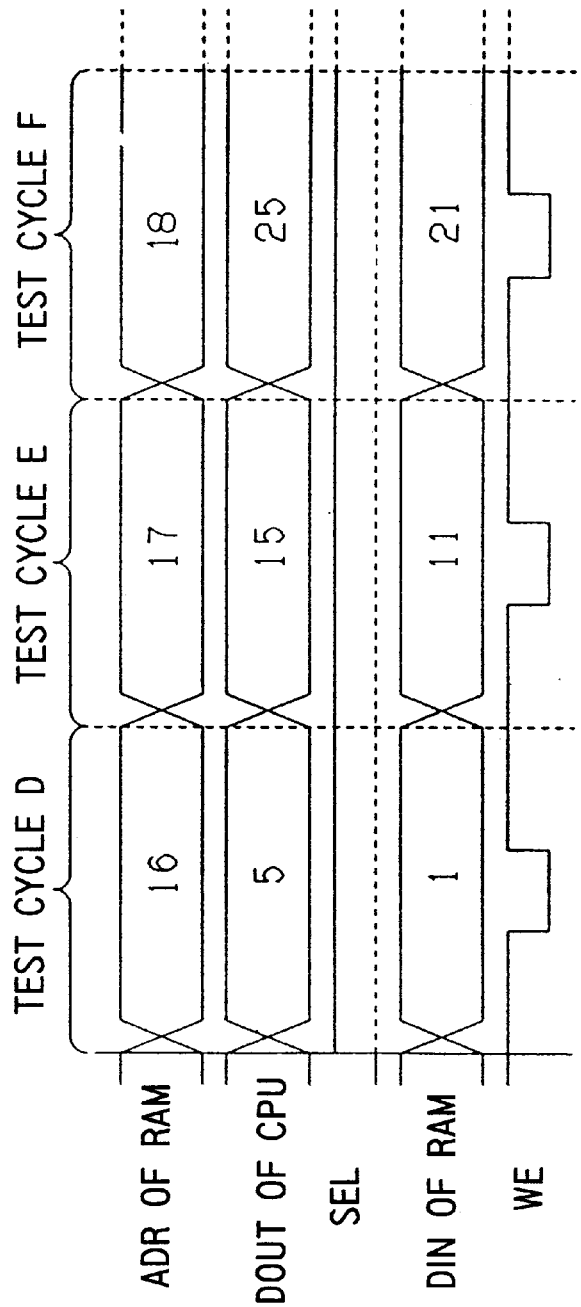

FIG.5

| ADR | DATA |
|---|---|
| 00 | 00 |
| 01 | 10 |
| 02 | 20 |
| ⋮ | ⋮ |
| 15 | |
| 16 | 01 |
| 17 | 11 |
| 18 | 21 |
| ⋮ | ⋮ |
| 31 | |

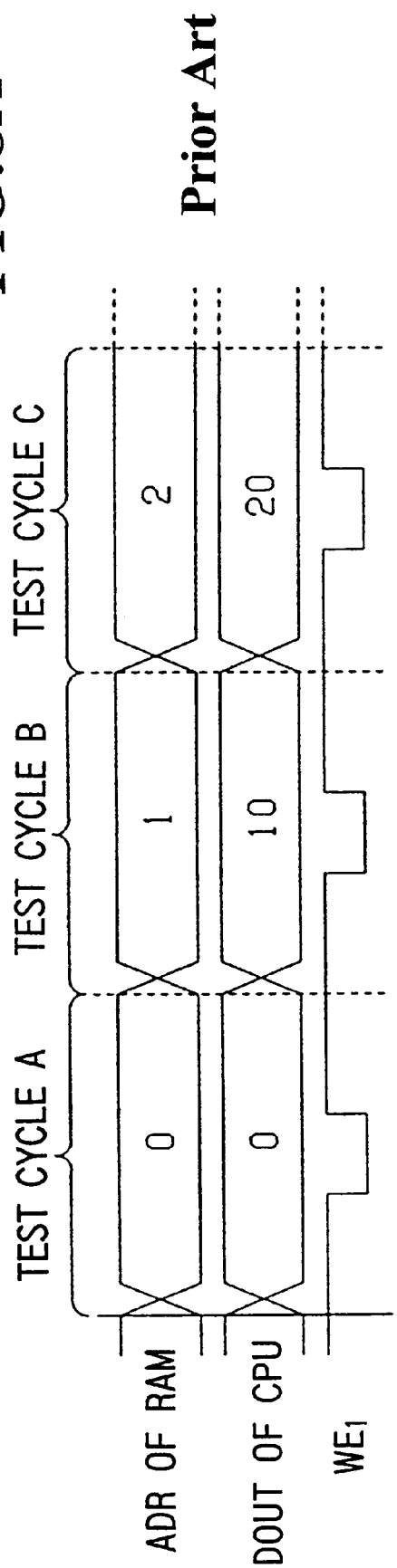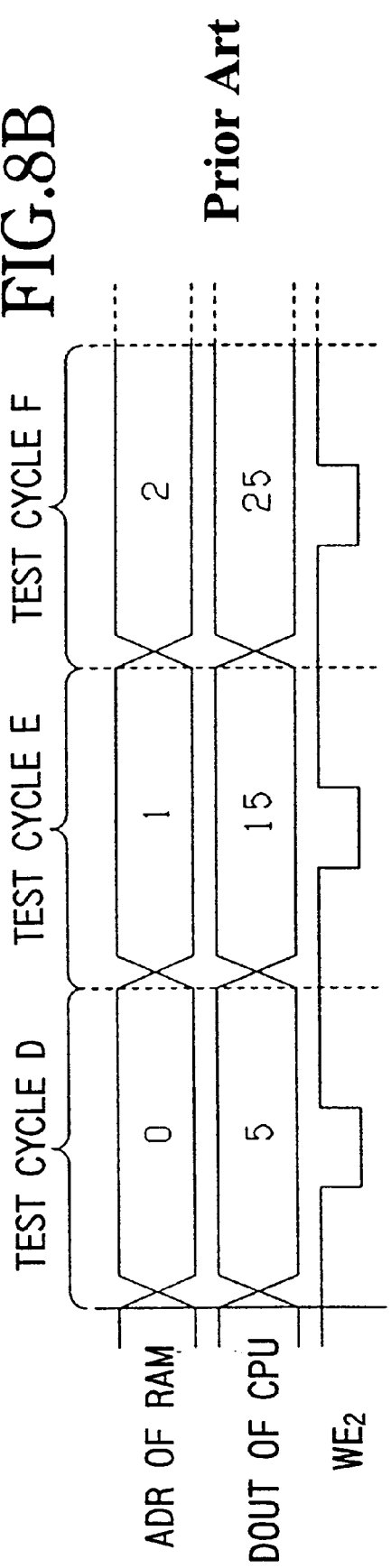

FIG.9A

| ADR | DATA |
|---|---|
| 00 | 00 |
| 01 | 10 |
| 02 | 20 |
| ⋮ | ⋮ |
| 15 | • |

Prior Art

FIG.9B

| ADR | DATA |
|---|---|
| 00 | 05 |
| 01 | 15 |
| 02 | 25 |
| ⋮ | ⋮ |
| 15 | • |

Prior Art

TIMING GENERATOR FOR TESTING SEMICONDUCTOR STORAGE DEVICES

BACKGROUND OF THE INVENTION

This invention relates to timing generators which generate test pulses used for testing of semiconductor storage devices.

The timing generators generate test pulses at predetermined timings. Herein, groups of test pulses are sequentially generated by predetermined intervals of time, so they are repeated by predetermined cycles. In some cases, the timing generators are requested to generate test pulses in such a way that generation of test pulses is started at different timing with respect to each of the cycles.

FIG. 7 is a block diagram showing an example of the timing generator which repeatedly generates test pulses. This example of the timing generator is designed to start generation of 2 test pulses at a different timing with respect to each of test cycles, wherein the 2 test pulses are disposed in time with a certain interval of time.

A central processing unit (i.e., CPU) 118 has 4 lines, i.e., a data line DOUT of m bits provided for read/write operations of data, an address line ADR of n bits and write enable lines WE1, WE2. Herein, the data line DOUT is used to access random-access memories (i.e., RAMs) 109-1 and 109-2. Incidentally, the address line ADR is designed as a 4-bit address line, for example.

FIGS. 8A and 8B are time charts showing waveshapes of signals monitored at several portions of the timing generator of FIG. 7. There are provided 6 test cycles, denoted by 'A' to 'F', which are used to write timing data to the RAMs 109-1 and 109-2. That is, the CPU 118 transfers different data on to the data line DOUT, address line ADR and write enable lines WE1, WE2 respectively with respect to each of the test cycles. Incidentally, data DOUT, outputted from the CPU 118, corresponds to timing data; and it is represented by a certain number in decimal notation.

In the test cycle A shown in FIG. 8A, the CPU 118 transfers '0' as an address ADR; it also transfers '0' as data DOUT. Herein, a selector 108 selects the address ADR outputted from the CPU 118. In addition, the CPU 118 outputs a write pulse WE1 onto the write enable line WE1 so that the RAM 109-1 is placed in a write enable state. Therefore, in the test cycle A, data '0' (i.e., timing data represented by a decimal number '0') is written into an address ADR0 of the RAM 109-1.

In the test cycles B and C, the CPU 118 operates similarly to the aforementioned test cycle A. Namely, in the test cycle B, data '10' is written into an address ADR1 of the RAM 109-1. In the test cycle C, data '20' is written into an address ADR2 of the RAM 109-1.

Next, in the test cycle D shown in FIG. 8B, the CPU 118 transfers '0' as an address ADR; and it also transfers '5' as data DOUT. Even in this test cycle, the selector 108 continues to select the address ADR outputted from the CPU 118. In addition, the CPU 118 outputs a write pulse onto the write enable line WE2 so that the RAM 109-2 is placed in a write enable state.

So, in the test cycle D, data '5' is written into an address ADR0 of the RAM 109-2. Similarly, in the test cycle E, data '15' is written into an address ADR1 of the RAM 109-2. In the test cycle F, data '25' is written into an address ADR2 of the RAM 109-2.

As described above, multiple timing data are written into the RAMs 109-1 and 109-2 respectively. Actually, certain timing data are written into all addresses of the RAMs 109-1 and 109-2. For convenience' sake, the description regarding write operations is given with respect to a limited number of test cycles, i.e., A to F; hence, the description regarding write operations of other test cycles is omitted.

FIG. 9A shows a memory map for storing the timing data in the RAM 109-1, whilst FIG. 9B shows a memory map for storing the timing data in the RAM 109-2.

Incidentally, a decimal number representing each timing data shows an elapsing time, using the unit of nano second (s) (abbreviated by 'ns'), which elapses from a reference time which is set in advance.

FIG. 10 is a time chart showing test cycles G to I which are used to read the timing data from the RAM 109-1 and 109-2.

Now, a reference clock signal T0 is input to a clock terminal 107 shown in FIG. 7. In the test cycle G, a clock pulse of the reference clock signal T0 is input to the clock terminal 107, so that a pattern generator 106, configured by a counter circuit, outputs the address ADR0. Herein, the selector 108 selects an output of the pattern generator 106. So, the address ADR0 is delivered to an address input ADR of the RAM 109-1 and an address input ADR of the RAM 109-2.

In the test cycle G, the CPU 118 outputs different data onto the data line DOUT, so data '0' is supplied to the RAM 109-1 whilst data '5' is supplied to the RAM 109-2. Herein, an output 'DOUT' of the RAM 109-1 is forwarded to a pulse generator 110-1, whilst an output 'DOUT' of the RAM 109-2 is forwarded to a pulse generator 110-2.

The aforementioned reference clock signal T0 is input to a delay line (or delay circuit) 111, wherein it is delayed by a certain delay time td whose value is know in advance. So, the delay line 111 outputs a trigger signal T0', which is delivered to the pulse generators 110-1 and 110-2 respectively. The trigger signal T0' consists of trigger pulses which delays from the clock pulses of the reference clock signal T0 by the delay time td.

So, the pulse generator 110-1 outputs a pulse of a pulse signal P1 after the elapsing time, which is set by the aforementioned timing data given from the RAM 109-1, elapses from a timing to input a trigger pulse of the trigger signal T0'. Similarly, the pulse generator 110-2 outputs a pulse of a pulse signal P2 after the elapsing time, which is set by the timing data given from the RAM 109-2, elapses from a timing to input a trigger pulse of the trigger signal T0'.

The aforementioned pulse signals P1 and P2 are subjected to logical sum (or OR operation) by an OR gate 114. So, the OR gate 114 provides an output pulse signal P0 at an output terminal 117.

In the test cycle G, the timing data given from the RAM 109-1 represents a decimal number '0', whilst the timing data given from the RAM 109-2 represents a decimal number '5'. So, in the test cycle G, a first output pulse appears at the output terminal 117 when the time 'td' elapses from the input timing of the clock pulse of the reference clock signal T0; and a second pulse appears when a time 'td+5ns' elapses after the input timing of the clock pulse.

In the next test cycle H, when a clock pulse of the reference clock signal T0 is input to the timing generator of FIG. 7, an address ADR1 outputted from the pattern generator 106 is delivered to the RAMs 109-1 and 109-2 via the selector 108.

On the basis of the address ADR1, an output DOUT of the RAM 109-1 corresponds to data '10' (see FIG. 9A), whilst an output DOUT of the RAM 109-2 corresponds to data '15' (see FIG. 9B). Thus, 2 pulses sequentially appear on the output pulse signal P0 of the output terminal 117 after an input timing of the clock pulse in the test cycle H. That is, a first pulse appears when a time 'td+10ns' elapses after the input timing of the clock pulse; then, a second pulse appears when a time 'td+1ns' elapses after the input timing of the clock pulse.

The aforementioned operations are repeated with respect to the other test cycles (e.g., test cycle I); hence, the description thereof will be omitted.

In short, the test cycles which starts from the test cycle G are used to provide 2 pulses (called 'test pulses') respectively. Herein, generation of the 2 test pulses differs in timing with respect to each test cycle, wherein a certain duration is maintained between the 2 test pulses, regardless of the test cycles.

The aforementioned example of the timing generator shown in FIG. 7 is designed to provide 2 test pulses with respect to each test cycle. For this reason, the timing generator requires 2 sets of the RAMs and pulse generators, wherein each of the RAMs is provided to store timing data whilst each of the pulse generators is provided to generate a single test pulse based on timing data with respect to each test cycle.

In general, the pulse generator has a complicated configuration which contains multiple counter circuits. This causes complication in overall circuit configuration of the timing generator as a whole. In addition, some timing generators require a large number of RAMs. In this case, the overall circuit configuration of the timing generator as a whole should be further complicated. In short, the complication in circuit configuration of the timing generator highly depends on the number of RAMs as well as the number of pulse generators. So, it is demanded to downsize the circuit configuration of the timing generator.

SUMMARY OF THE INVENTION

It is an object of the invention to provide a timing generator which is capable of generating multiple pulses with a downsized circuit configuration.

A timing generator of this invention operates in response to test cycles to generate test pulses for testing of semiconductor storage devices. For example, the timing generator is designed to generate two pulses with respect to each test cycle. Herein, a RAM stores timing data under the control of a CPU. When reading the timing data from the RAM, the timing generator receives a reference clock signal, on which clock pulses repeatedly occur by a certain period in synchronization with the test cycles, to produce a clock signal which contains two pulses with respect to each test cycle. Two read addresses are sequentially generated based on the reference clock signal and clock signal. Each read address is represented by a binary code consisting of a number of bits, one of which is inverted in response to the clock signal. So, the two timing data are sequentially read from the two read addresses of the RAM with respect to each test cycle. A pulse generator receives the two timing data to generate two test pulses with respect to each test cycle. Herein, generation of the two pulses is initiated when a time represented by the timing data elapses from a trigger signal, whilst a constant interval of time is provided between the two test pulses, regardless of the test cycles.

BRIEF DESCRIPTION OF THE DRAWINGS

The se and other objects of the subject invention will become more fully apparent as the following description is read in light of the attached drawings wherein:

FIGS. 4A and 4B are time charts showing signals monitored at several portions of the timing generator of FIG. 1 with respect test cycles A to F regarding write operations of timing data;

FIG. 5 shows a memory map of a RAM shown in FIG. 1;

FIGS. 8A and 8B are time charts showing signals monitored at several portions of the timing generator of FIG. 7 with respect to write operations of timing data;

FIGS. 9A and 9B are memory maps of RAMs shown in FIG. 7; and

DESCRIPTION OF THE PREFERRED EMBODIMENT

Now, a description will be given with respect to a timing generator which is designed in accordance with an embodiment of the invention.

Figure 1:
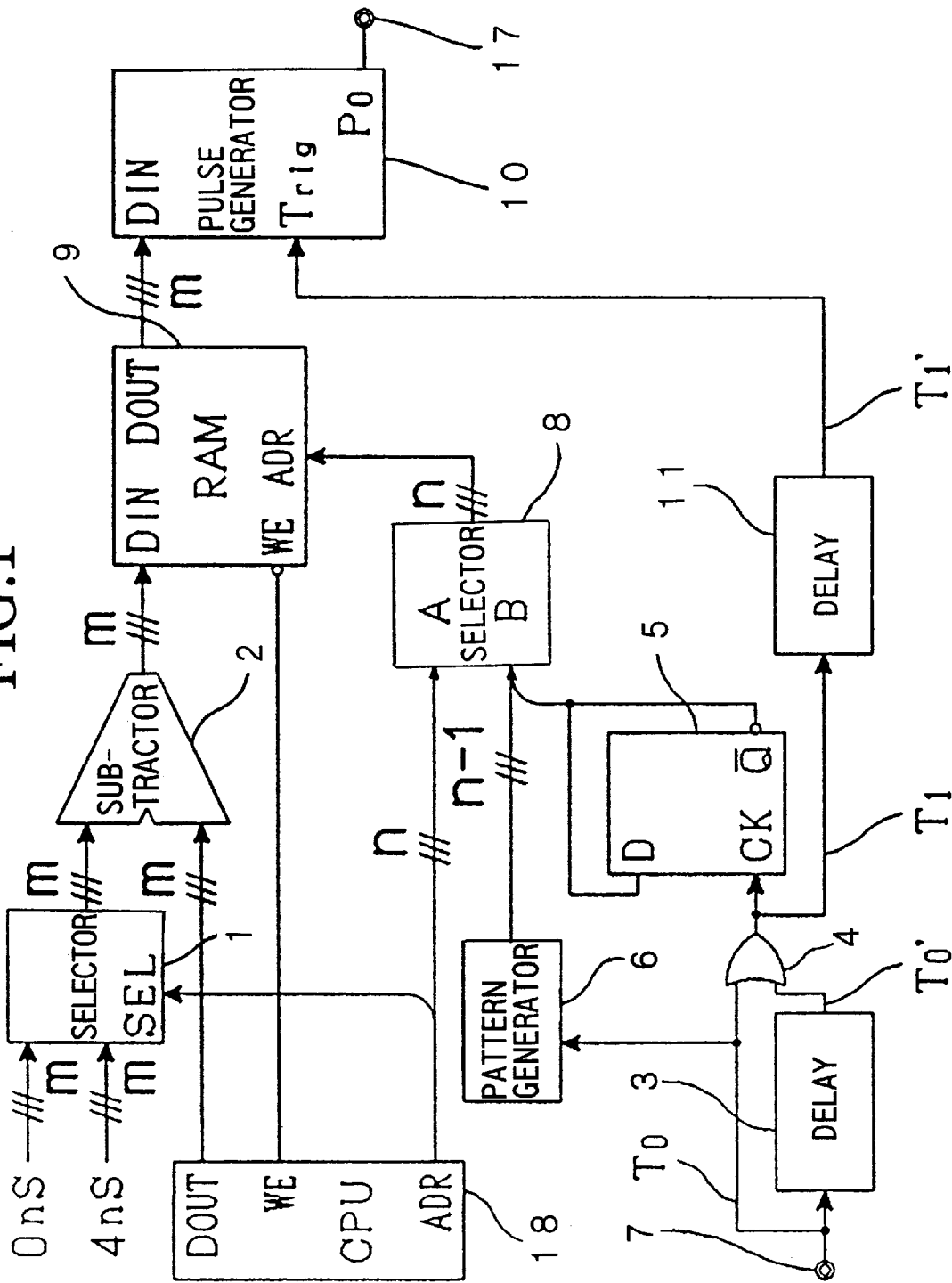
FIG. 1 is a block diagram showing a timing generator which is designed in accordance with an embodiment of the invention.

FIG. 1 is a block diagram showing a circuit configuration of the timing generator of the present embodiment.

In FIG. 1, a CPU 18 provides a data line DOUT of m bits, an address line ADR of n bits and a write enable line WE.

The address line ADR of the CPU 18 is connected to an input terminal A of a selector 8. In addition, a highest-bit line of the n-bit address line ADR is connected to a select terminal SEL of a selector 1. Herein, the highest-bit line is used to transmit a single bit which corresponds to a highest bit position of n-bit data transmitted on the n-bit address line ADR.

The selector 1 receives 2 inputs, each of which corresponds to m-bit data. In response to a digit of data (i.e., a highest bit) transmitted on the highest-bit line of the n-bit address line ADR, the selector 1 selects one of the 2 inputs. In the present embodiment, the selector 1 receives data '0' representing a time of 0 ns and data '4' representing a time of 4 ns.

Namely, if the highest bit of address data ADR outputted from the CPU 18 is '0', the selector 1 selects the data '0'. If the highest bit is '1', the selector 1 selects the data '4'.

A subtractor 2 has 2 inputs. Herein, an output (i.e., m-bit data) of the selector 1 is forwarded to a first input of the subtractor 2, whilst m-bit data DOUT outputted from the CPU 18 is forwarded to a second input of the subtractor 2.

Next, a reference clock signal T0 is input to a clock terminal 7. The reference clock signal T0 is forwarded to a first input of an OR gate 4 and is also supplied to a delay line 3. Herein, the reference clock signal consists of clock pulses which repeatedly appear by a certain period in synchronization with the test cycles.

The delay line 3 imparts a delay time td1 to the reference clock signal T0 so as to provide a delayed reference clock signal T0'. The delay time td1 is set shorter than the period of the reference clock signal T0. In the present embodiment, for example, a time of 4 ns is set to the delay time td1. The delayed reference clock signal T0' is supplied to a second input of the OR gate 4.

The OR gate 4 performs an OR operation on the 2 inputs thereof to produce a clock signal T1', which is forwarded to a clock input of a D-type flip-flop 5 and is also supplied to a delay line 11. The delay line 11 imparts a predetermined delay time td2 to the clock signal T1 to produce a delayed clock signal T1'. Herein, the delay time td2 is provided to compensate a time which is required to read out timing data from the RAM 9.

In addition to the aforementioned clock input CK, the flip-flop 5 has an input D and an inverted output Q with bar (i.e., $\overline{Q}$). The inverted output of the flip-flop 5 is added to (n-1)-bit data, corresponding to a pattern address generated by a pattern generator 6, as its highest bit. Thus, a n-bit pattern address is formed. The n-bit pattern address is supplied to an input B of the selector 8.

In the selector 8, the input A corresponds to the n-bit address outputted from the CPU 18, whilst the input B corresponds to the n-bit pattern address. So, the selector 8 selects one of them. An output of the selector 8 (i.e., either the n-bit address or n-bit pattern address) is forwarded to an address input ADR of a RAM9.

An output of the subtractor 2 is forwarded to a data input DIN of the RAM 9. In addition, the aforementioned write enable line WE of the CPU 18 is connected to a write enable terminal WE of the RAM 9.

A data output DOUT of the RAM 9 is forwarded to a data input DIN of a pulse generator 10. In addition, the aforementioned delayed clock signal T1' of the delay line 11 is forwarded to a trigger input Trig of the pulse generator 10 as a trigger signal.

Figure 2:
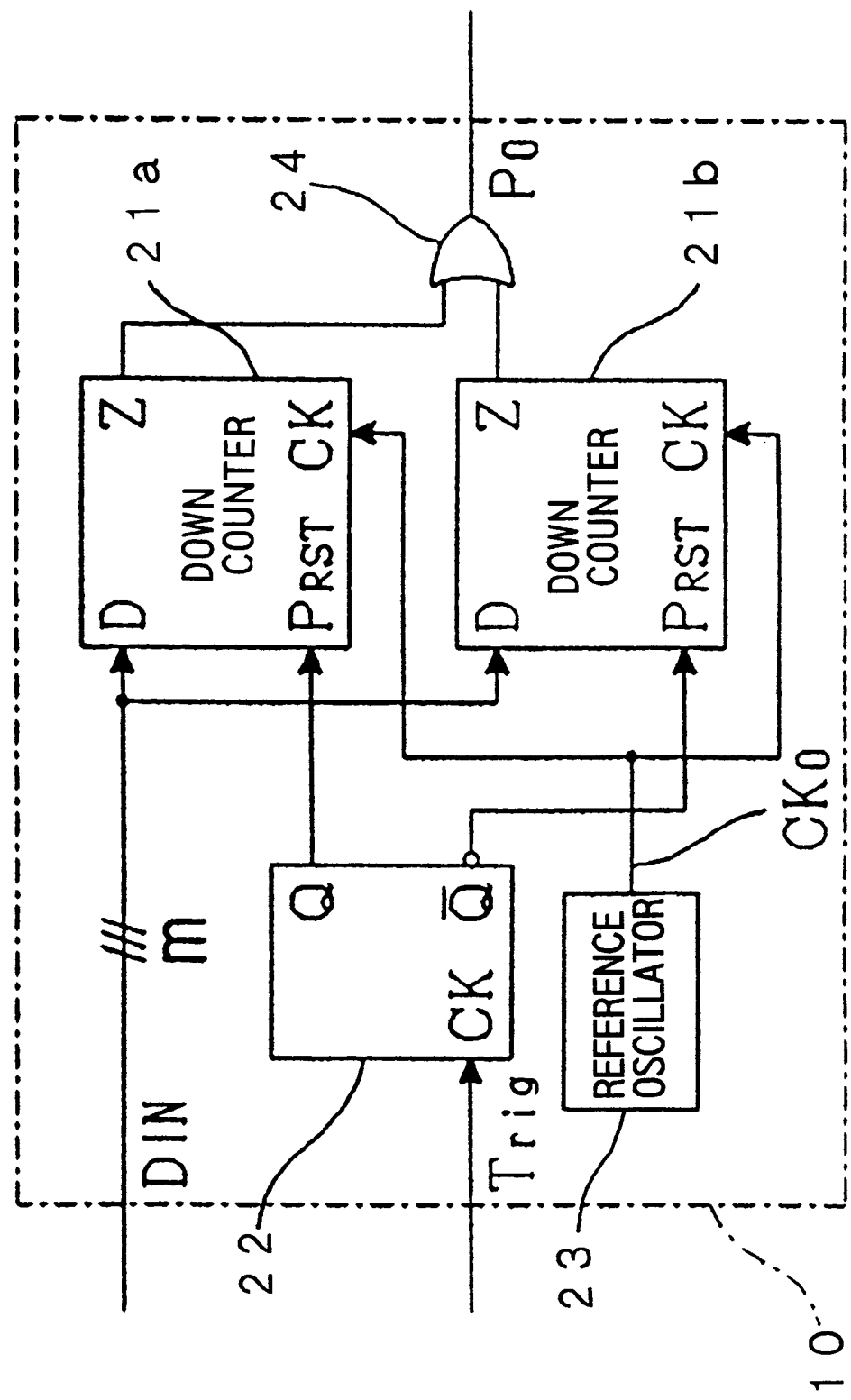
FIG. 2 is a block diagram showing an internal configuration of a pulse generator shown in FIG. 1.

FIG. 2 is a block diagram showing an internal configuration of the pulse generator 10. Herein, m-bit data input to a data input DIN of the pulse generator 10 is delivered to data inputs D of down counters 21a and 21b.

Each of the down counters 21a and 21b is configured as a m-bit counter which reduces a count value thereof every time a clock pulse is applied thereto. Herein, a clock signal CK0, consisting of clock pulses, are generated by a reference oscillator 23 and is input to clock terminals CK of the down counters 21a and 21b. When the count value is reduced to zero, each down counter provides a pulse at a zero output terminal Z thereof An OR gate 24 receives the zero output 'Z' of the down counter 21a as well as the zero output 'Z' of the down counter 21b. Those zero outputs are subjected to logical sum (or OR operation), a result of which is provided as an output pulse signal P0 of the pulse generator 10.

The reference oscillator 23 is configured by a self oscillator such as a CR oscillator and a crystal oscillator. The reference oscillator 23 is capable of generating the clock signal CK0 consisting of clock pulses each of which emerges by a minimum unit time (e.g., 1 ns) corresponding to minimum timing which can be set to the timing generator of the present embodiment.

Each of the down counters 21a and 21b has a preset terminal PRST for inputting a preset signal. When the preset signal is input to the preset terminal PRST, a value corresponding to the data input D is preset to the down counter as its count value.

The aforementioned delayed clock signal (i.e., trigger signal) T1', which is supplied to the trigger input Trig of the pulse generator 10, is forwarded to a clock terminal CK of a T flip-flop 22. Every time a clock pulse of the trigger signal T1' is input to the clock terminal CK of the T flip-flop 22, a noninverting output Q and an inverting output $\overline{Q}$ are changed over in states. The noninverting output is forwarded to the preset terminal PRST of the down counter 21a, whilst the inverting output is forwarded to the preset terminal PRST of the down counter 21b.

Figure 3:
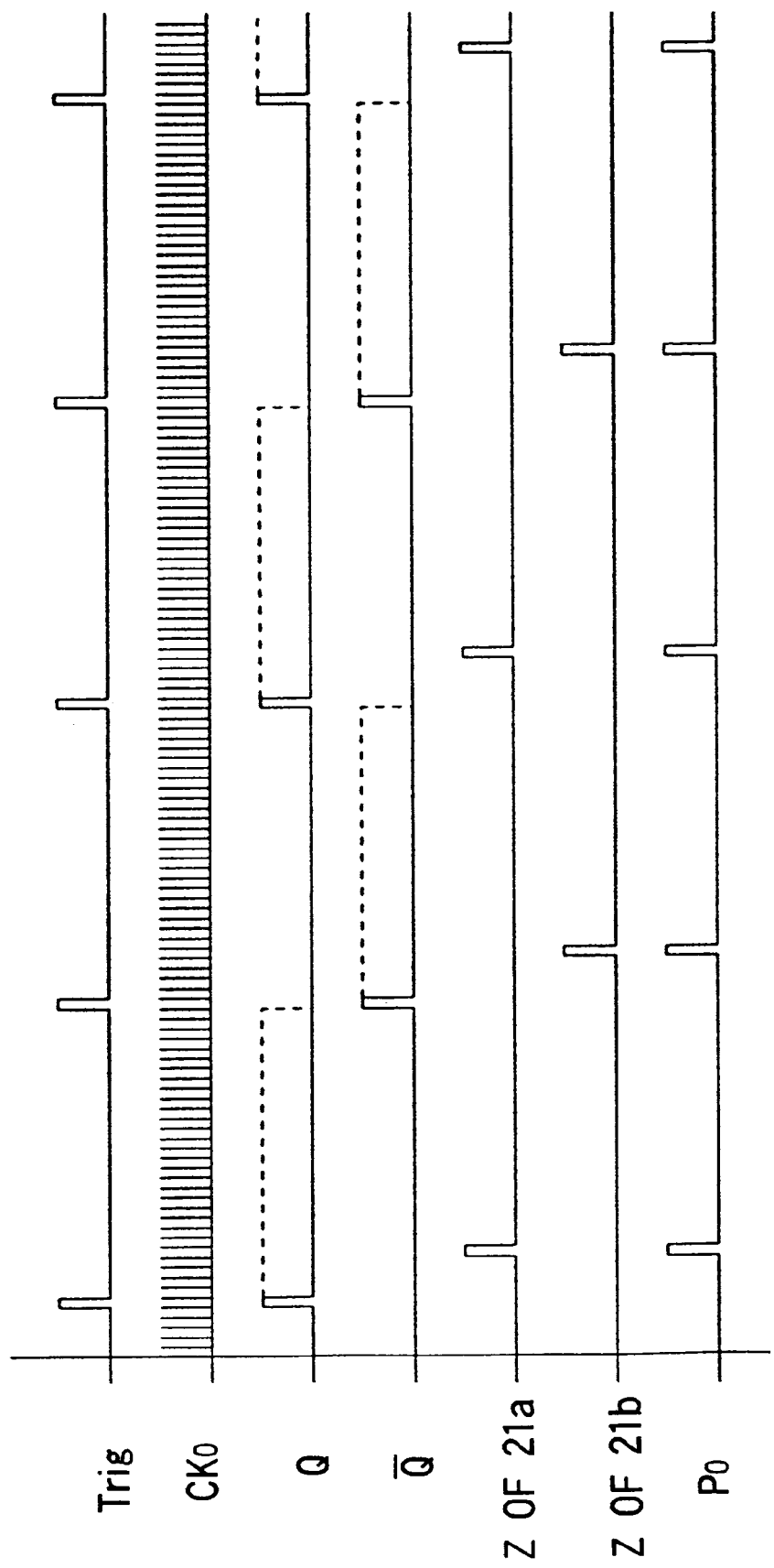
FIG. 3 is a time chart showing signals monitored at several portions of the pulse generator of FIG. 2.

FIG. 3 is a timing chart showing examples of signals monitored at several portions of the pulse generator 10 of FIG. 2. In FIG. 3, a time of 1 ns is set to a period of the clock signal CK0, and a value of '5' is set to the data D preset to the down counter, for example.

In the pulse generator 10, the down counters 21a and 21b are alternatively preset as shown in FIG. 3. So, it is possible to provide the output pulse signal P0 which is delayed from the trigger input Trig by 5 ns. Namely, each of output pulses of the output pulse signal P0 is normally delayed from each of clock pulses of the trigger signal T1' supplied to the trigger input Trig.

Next, a description will be given with respect to operations of the timing generator of the present embodiment. For convenience' sake, the description is given with respect to the case where the address ADR consists of 5 bits, and 2 output pulses, which depart from each other by 5 ns, are provided as the output pulse signal P0.

FIGS. 4A and 4B are time charts showing signals monitored at several portions of the timing generator of FIG. 1. Herein, test cycles A to F are provided for write operations to write timing data into the RAM 9.

In the test cycle A, the CPU 18 outputs data '0' as the address ADR; and it also outputs data '0' as the data output DOUT. Herein, the selector 8 selects the input A which corresponds to the address ADR outputted from the CPU 18.

If the address ADR is '0', its highest bit must be '0'. So, the selector 1 selects the data '0' input thereto. The subtractor 2 subtracts the data '0' of the selector 1 from the data output DOUT of the CPU 18 which is '0'. So, the subtractor 2 outputs '0' as a result of subtraction thereof.

Figure 5:
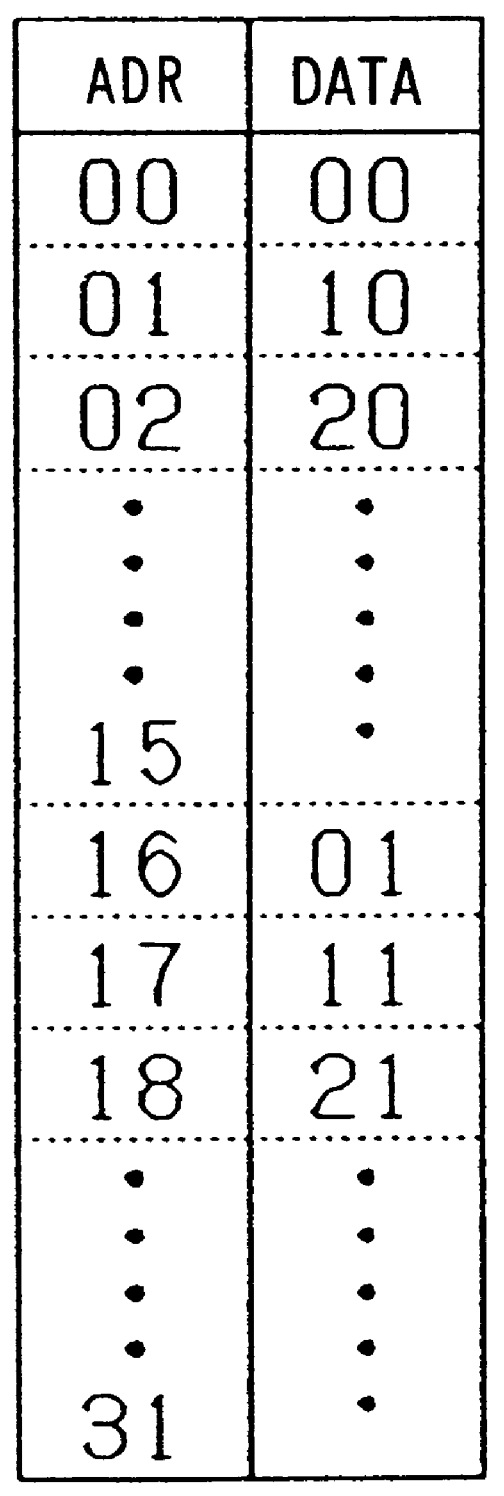

The CPU 18 outputs a write pulse WE, so an output of the subtractor 2 is written into an address ADR0 of the RAM 9. That is, '0' is written into the address ADR0 of the RAM 9 in the test cycle A. FIG. 5 shows an example of a memory map of the RAM 9.

The CPU 18 performs operations similar to the aforementioned operations in the next test cycles to form the memory map of FIG. 5. So, '10' is written into an address ADR1 of the RAM 9 in the test cycle B. In the test cycle C, '20' is written into an address ADR2 of the RAM 9. Similarly, appropriate values are sequentially written into addresses which range from ADR3 to ADR15. In all of the addresses ADR1 to ADR15, the highest bit normally corresponds to 0. So, the selector 1 continuously selects the data '0' with respect to the addresses ADR1 to ADR15.

Next, in the test cycle D, the CPU 18 outputs '16' as the address ADR; and it also outputs '5' as the data output DOUT. In this case, the selector 8 continuously selects the input A which corresponds to the address ADR of the CPU 18.

When the 5-bit address ADR is '16' in decimal notation, its highest bit is '1'. So, the selector 1 selects the data '4'. The subtractor 2 subtracts '4' from the data output DOUT of the CPU 18 which is '5'. Thus, the subtractor 2 provides a result of subtraction which is '1'.

The CPU 18 outputs a write pulse WE for the test cycle D, so that an output of the subtractor 2 is written into an address ADR16 of the RAM 9. That is, '1' is written into the address ADR16 of the RAM 9.

Next, the CPU 18 provides '15' as the data output DOUT in the test cycle E; thereafter, it provides '25' as the data output DOUT in the test cycle F.

In all of addresses ADR16, ADR17 and ADR18 which correspond to the test cycles D, E and F respectively, the highest bit normally corresponds to '1'. So, the selector 1 continuously selects the data '4'.

As a result, '11' is written into the address ADR17 of the RAM 9; then, '21' is written into the address ADR18 of the RAM 9. The CPU 18 performs similar operations on other addresses which range from ADR19 to ADR31. Incidentally, in all the addresses ADR16 to ADR31, the highest bit normally corresponds to '1', so the selector 1 continuously selects the data '4'.

Figure 6:
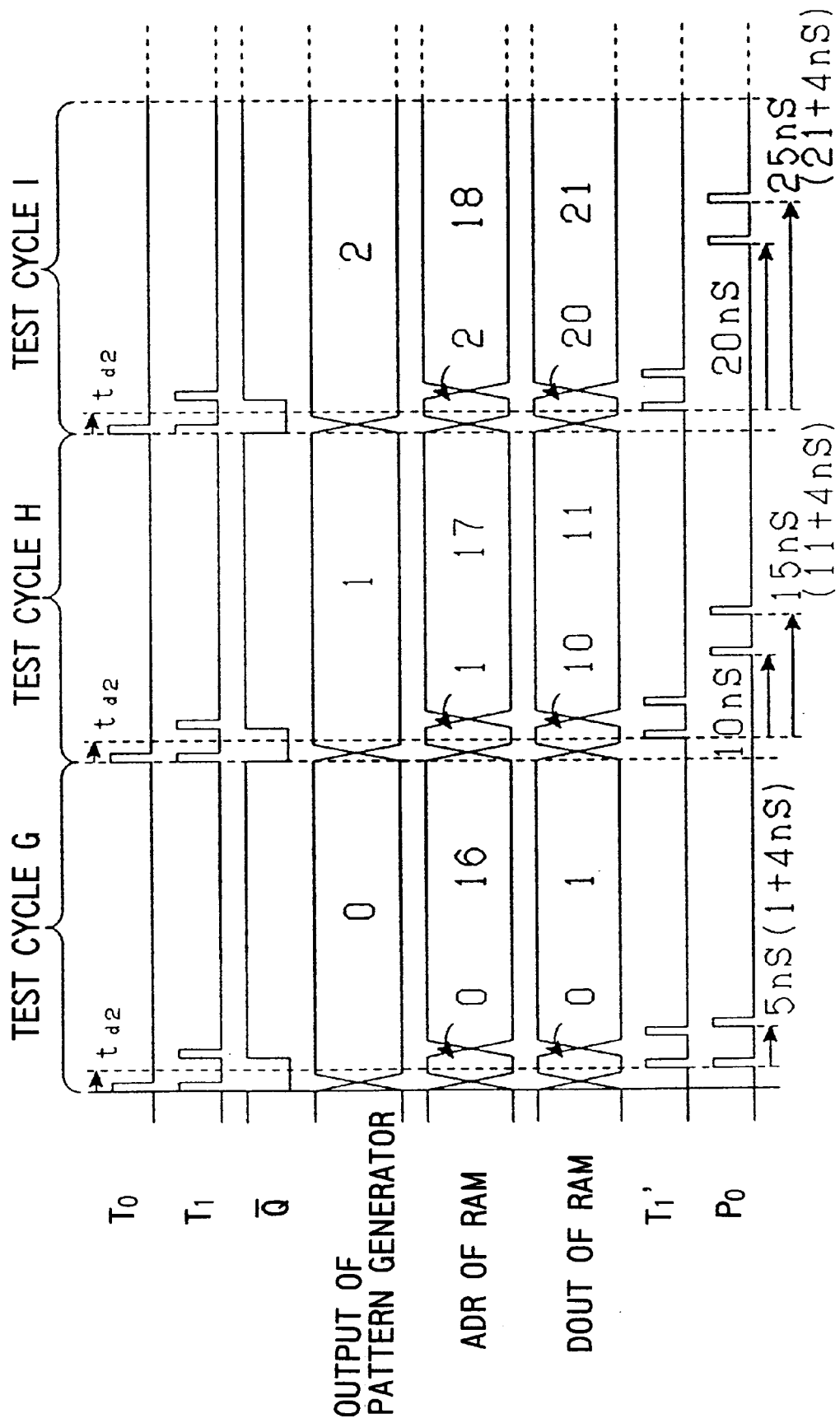
FIG. 6 is a time chart showing signals monitored at several portions of the timing generator of FIG. 1 with respect to test cycles G to I regarding generation of pulses.
Figure 7:
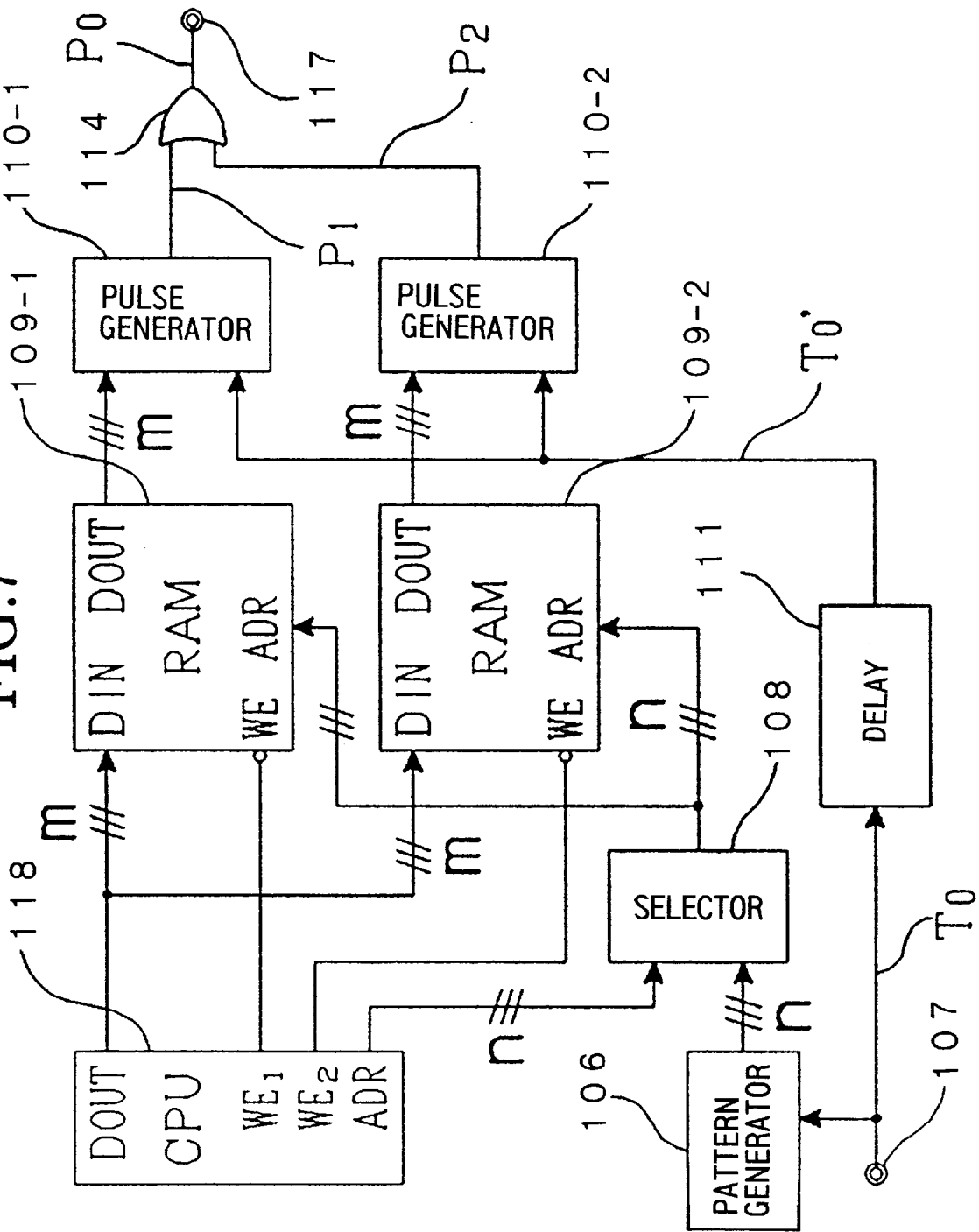
FIG. 7 is a block diagram showing an example of the timing generator which is used as the basis for designing the embodiment of the invention.
Figure 10:
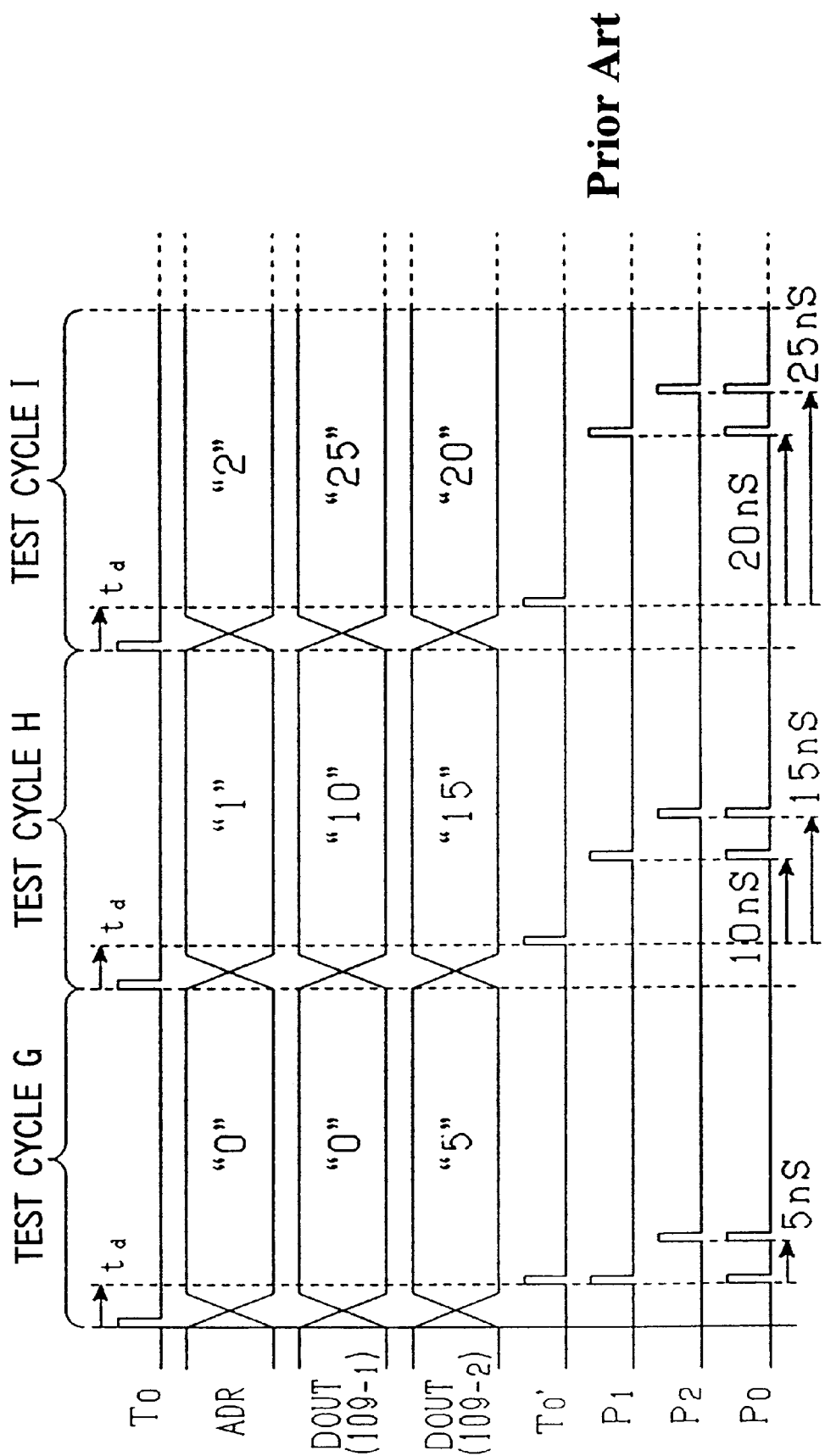
FIG. 10 is a time chart showing signals monitored at several portions of the timing generator of FIG. 7 with respect to generation of test pulses.

Next, FIG. 6 is a time chart showing signals monitored at several portions of the timing generator of FIG. 1 with respect to test cycles G to I. Herein, the test cycles G to I are used to perform read operations to read out timing data from the RAM 9. In all of the test cycles G to I, the selector 8 selects the input B. At the beginning of the test cycle G, '1' is set to the inverting output $\overline{Q}$ of the flip-flop 5.

When a clock pulse of the reference clock signal T0 is input to the clock terminal 7 in the test cycle G, the pattern generator 6, configured by the counter circuit, generates an address ADR0.

The above clock pulse is directly input to the first input of the OR gate 4. The clock pulse of the reference clock signal T0 is delayed by the delay line 3, from which a delayed clock pulse of the delayed clock signal T0' is outputted. So, the delayed clock pulse is input to the second input of the OR gate 4.

As a result, the clock signal T1 outputted from the OR gate 4 consists of 2 pulses which depart from each other by 4 ns. The flip-flop 5 provides the inverting output based on the clock signal T1. Thus, the inverting output is firstly placed in a low level (i.e., '0') in a duration of 4 ns; then, it is changed to a high level (i.e., '1'). In the test cycle G, the inverting output is set at '0' only in the duration of 4 ns; thereafter, it is retained at '1'.

As described before, the inverting output of the flip-flop 5 is added to the output of the pattern generator 6 as its highest-order bit, thus 5-bit address is formed and is supplied to the input B of the selector 8. In the test cycle G, the output of the pattern generator 6 is '0' (i.e., '0000' in binary notation). So, if the inverting output of the flip-flop 5 is '0', the 5-bit address input to the selector 8 is represented by '00000' in binary notation, which indicates '0' in decimal notation. If the inverting output is '1', the 5-bit address is represented by '10000' in binary notation, which indicates '16' in decimal notation. For this reason, '0' is supplied to the address terminal ADR of the RAM 9 in the aforementioned duration of 4 ns within the test cycle G; thereafter, '16' is supplied to the address terminal ADR of the RAM 9.

In response to the addresses described above, the timing data are sequentially read from the RAM 9 in accordance with the memory map of FIG. 5. In the duration of 4 ns of the test cycle G, the address is '0' (i.e., ADR0), so the timing data of '0' is read from the RAM 9 as the data output DOUT. Thereafter, the address is '16' (i.e., ADR16), so the timing data of '1' is read from the RAM 9 as the data output DOUT. The data output DOUT of the RAM 9 is forwarded to the data input DIN of the pulse generator 10.

By the way, the aforementioned delay line 11 delays the clock signal T1 by the prescribed delay time to provide the delayed clock signal T1', which is forwarded to the trigger input Trig of the pulse generator 10. As the clock signal T1 consists of 2 pulses with respect to each test cycle, the delayed clock signal T1' consists of 2 pulses correspondingly. The pulses of the delayed clock signal T' are used as trigger pulses for the pulse generator 10.

In the test cycle G, when a first trigger pulse is input to the pulse generator 10, the timing data is '0'. At the input timing of the first trigger pulse, the pulse generator 10 provides a first output pulse as the output pulse signal P0.

A second trigger pulse is input to the pulse generator 10 when a time of 4 ns elapses from the inputting of the first trigger pulse. At this timing, the timing data is '1'. So, the pulse generator 10 provides a second output pulse when a time of 1 ns elapses from the second trigger pulse. As a result, in the test cycle G, the first output pulse emerges on the output pulse signal P0 at the input timing of the first trigger pulse; then, the second output pulse emerges when a time of 5 ns (i.e., 1+4) elapses from the first trigger pulse.

Next, in the test cycle H, when a clock pulse of the reference clock signal T0 is input to the clock terminal 7, the output of the pattern generator 6 is represented by '1' (i.e., '0001').

Similar to the aforementioned test cycle G, the inverting output of the flip-flop 5 is at '0' in a duration of 4 ns of the test cycle H; thereafter, it is retained at '1'.

Therefore, in the duration of 4 ns of the test cycle H, the 5-bit address outputted from the selector 8 is represented by '00001'(i.e., '1' in decimal notation), so an address ADR1 is supplied to the address terminal ADR of the RAM 9. Thereafter, the 5-bit address is represented by '10001' (i.e., '17' in decimal notation), so an address ADR17 is supplied to the address terminal ADR of the RAM 9.

In the test cycle H, the timing data are read from the RAM 9 with respect to the addresses ADR1 and ADR17 respectively. That is, the data output DOUT of the RAM 9 is '10' in the duration of 4 ns of the test cycle H; thereafter, it is retained at '11'. Those timing data are supplied to the pulse generator 10.

Similar to the foregoing, 2 pulses of the delayed clock signal T1' are sequentially input to the trigger input Trig of the pulse generator 10 as trigger pulses with respect to the test cycle H.

At the input timing of a first trigger pulse in the test cycle H, the timing data input to the pulse generator 10 is '10'. So, a first output pulse emerges on the output pulse signal P0 when a time of 10 ns elapses from the input timing of the first trigger pulse.

A second trigger pulse is input to the pulse generator 10 when the time of 4 ns elapses from the first trigger pulse. At the input timing of the second trigger pulse, the timing data is '11'. So, a second output pulse emerges on the output pulse signal P0 when a time of 11 ns elapses from the second trigger pulse. As a result, the first output pulse emerges when the time of 10 ns elapses from the first trigger pulse; then, the second output pulse emerges when a time of 15 ns (i.e., 4+11) elapses from the first trigger pulse.

Operations of the test cycle I are similar to those of the aforementioned test cycles G and H. Hence, details of the test cycle I is omitted. In the test cycle I, the pulse generator 10 operates based on the timing data ('20' and '21'), which are read from the RAM 9 with respect to addresses ADR2 and ADR18 respectively, as well as 2 trigger pulses. As a result, a first output pulse emerges on the output pulse signal P0 when a time of 20 ns elapses from the first trigger pulse;

then, a second output pulse emerges when a time of 25 ns (i.e., 21+4) elapses from the first trigger pulse.

The present embodiment shown in FIG. 1 requires only one pulse generator which is capable of providing 2 output pulses which depart from each other by the prescribed interval of time.

Incidentally, the present embodiment merely shows examples of the timing to generate the pulses with respect to each test cycle, wherein the prescribed interval of time between the pulses is merely an example. In addition, the present embodiment merely shows examples of addresses, data and numbers of bits. Hence, this invention is not limited to such an embodiment. Of course, the present embodiment can be modified in a variety of ways within the scope of the invention.

The aforementioned D-type flip-flop 5 can be replaced by another electronic component which is capable of providing an inverting output based on the clock signals T0 and T0'. For example, it is possible to employ a R-S flip-flop.

The present embodiment shows that the inverting output of the flip-flop 5 is added to the (n-1)-bit output of the pattern generator 6 to form the n-bit address wherein the inverting input is used as the highest bit of the n-bit address. As described before, the present embodiment merely shows examples of the configuration and operation of this invention. So, the inverting output can be located at another bit position of the n-bit address.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A timing generator that generates a plurality of pulses, which depart from each other by a predetermined interval of time, at predetermined timings, comprising:

address generating means for generating a first address by performing a counting operation on a first reference signal;

first delay means for imparting a first delay time to the first reference signal to produce a second reference signal;

flip-flop circuit means for producing an output that is inverted by the first reference signal and the second reference signal alternatively;

storing means for storing a first timing data to a second address within said storing means and for outputting the first timing data wherein the second address represents a combination of the first address and the output of the flip-flop circuit means; and pulse generating means having a trigger terminal and outputting a pulse constituting a part of said plurality of pulses, wherein the timing of said pulse is representative of the time when the trigger terminal receives the second reference signal and when said pulse generating means receives the stored first timing data, wherein the storing means has a plurality of storage areas each of which stores the first timing data and each of which is designated by the first address, so a difference between the timing data respectively written at adjacent storage areas corresponds to a difference between said predetermined interval of time and the first delay time, and wherein said plurality of pulses depart from each other by the predetermined interval of time.

2. The timing generator of claim 1, said flip-flop circuit means comprising an OR means which performs an OR operation on the first reference signal and the second reference signal, and a flip-flop means wherein a result of the OR operation is input to a clock terminal of the flip-flop means so that the output of the flip-flop means is inverted.

3. The timing generator as defined in claim 2, further comprising second delay means for transferring an output of the OR means to the trigger terminal of the pulse generating means, wherein the second delay means is provided to compensate for a second delay time which is required to read out the first timing data from the storing means.

4. The timing generator as in any one of claims 1 to 3, further comprising:

control means for outputting a second timing data corresponding to the second address and for outputting a write signal enabling the storing means to write the first timing data into the storing means;

selecting means for determining from the output of the flip-flop circuit means whether the first delay time of the first delay means is valid based on the output of the flip-flop means, wherein the output of the flip-flop means; and subtraction means for subtracting a predetermined time value representative of the first delay time from the second timing data to produce the first timing data.

5. A timing generator which operates in response to test cycles, comprising:

control means for producing data and a write address which is changed over in response to each of the test cycles; means for providing time data having a value that is changed over in response to the write address;

subtraction means for performing subtraction on the data and the time data to produce timing data;

storing means for storing the timing data at the write address thereof with respect to each of the test cycles;

clock signal generating means for generating a clock signal based on a reference clock signal synchronized with the test cycles, wherein the clock signal contains at least two clock pulses, which depart from each other by a first delay time that is less than a period of the reference clock signal, with respect to each of the test cycles;

read address generating means for generating at least two read addresses representative of at least two timing data retained within the storing means based on the reference clock signal and the clock signal with respect to each of the test cycles, wherein each read address is represented by a binary code consisting of a number of bits, at least one of which is inverted in response to the clock signal, and wherein the at least two timing data are sequentially read from the at least two read addresses with respect to each of the test cycles;

delay means for delaying the clock signal by a second delay time that is provided to compensate a time required to read out the timing data from the storing means and for producing a trigger signal; and pulse generating means for generating at least two pulses on the basis of the trigger signal as well as the at least two timing data with respect to each of the test cycles, wherein generation of the at least two pulses is initiated when a time representative of the timing data elapses from the trigger signal, and while maintaining a constant interval between the at least two pulses.

6. The timing generator of claim 5, wherein the clock signal generating means is configured by a delay line for delaying the reference clock signal by the first delay time and an OR gate for performing an OR operation on the reference clock signal and an output of the delay line.

7. The timing generator of claim 5, wherein the read address generating means is configured by a pattern generator for generating a pattern address based on the reference clock signal and a flip-flop said read address generating means combining having an output that is inverted in response to the clock signal, and wherein the pattern address and the output of the flip-flop to form the read addresses.

8. The timing generator of claim 5, wherein the storing means comprises a RAM.

* * * * *

UNITED STATES PATENT AND TRADEMARK OFFICE
CERTIFICATE OF CORRECTION

PATENT NO. : 6,061,816
DATED : May 9, 2000
INVENTOR(S) : Akira Shimizu

It is certified that error appears in the above-identified patent and that said Letters Patent is hereby corrected as shown below:

Column 9, claim 1,
Line 53, after "timing data", insert a comma -- , --.

Column 10, claim 2,
Line 6, after "signal", delete the comma ","; and after "means", insert a comma -- , --.

Column 10, claim 4,
Lines 24-25, after "flip-flop means", delete " wherein the output of the flip-flop means".

Column 12, claim 7,
Lines 1-2, after "flip-flop", delete "said read address generating means combining".
Line 3, after "wherein", insert -- said read address generating means combining --.

Signed and Sealed this

Thirteenth Day of November, 2001

Attest:

*Nicholas P. Godici*

NICHOLAS P. GODICI
*Acting Director of the United States Patent and Trademark Office*

*Attesting Officer*